United States Patent
Chang et al.

(10) Patent No.: US 6,605,876 B2
(45) Date of Patent: Aug. 12, 2003

(54) SEMICONDUCTOR CHIP PACKAGE AND CONNECTION STRUCTURE INCLUDING A GROUND METAL PLANE HAVING BLANK PATTERNS

(75) Inventors: Tae-Sub Chang, Seoul (KR); Dong-Ho Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/006,307

(22) Filed: Dec. 4, 2001

(65) Prior Publication Data

US 2002/0100987 A1 Aug. 1, 2002

(30) Foreign Application Priority Data

Jan. 31, 2001 (KR) .......................................... 2001-4540

(51) Int. Cl.[7] .............................................. H01L 23/48
(52) U.S. Cl. ....................... 257/781; 257/778; 257/668
(58) Field of Search ............................... 257/781, 668, 257/673, 675, 706, 780, 778, 738, 691, 774, 737, 700

(56) References Cited

U.S. PATENT DOCUMENTS 5,983,493 A * 11/1999 Eldridge et al. ............. 228/179
6,194,778 B1 * 2/2001 Ohsawa et al. ............. 257/668

* cited by examiner

Primary Examiner—Amir Zarabian
Assistant Examiner—Kiesha Rose
(74) Attorney, Agent, or Firm—Marger Johnson & McCollom, P.C.

(57) ABSTRACT

An electrical connection structure for electrically connecting a semiconductor chip to an external circuit device is provided. The connection structure comprises a ground conductive plate connected to ground power of the semiconductor chip; an insulating layer formed on the ground conductive plate; a signal pattern layer formed on the insulating layer and having signal patterns in electrical communication with the semiconductor chip. The ground conductive plate includes a projected blank pattern that is the complement of the signal pattern layer. With the present invention, self inductance and mutual inductance of the connection structure is reduced. Further, because of the blank patterns formed in the proximal ground plate, the capacitance is also reduced. Therefore, both the switching output noise and cross talk is simultaneously prevented in very high frequency operation and hence electrical characteristics and performance are significantly improved in package devices such as wafer level packages and ball grid array packages operating at high data rates.

14 Claims, 4 Drawing Sheets

SEMICONDUCTOR CHIP PACKAGE AND CONNECTION STRUCTURE INCLUDING A GROUND METAL PLANE HAVING BLANK PATTERNS

BACKGROUND OF THE INVENTION

1. Field of the Invention

This invention relates to a semiconductor packaging technology, and more particularly to a semiconductor chip package and a novel connection structure for use in the package, which improves high frequency characteristics of the semiconductor chip package.

2. Description of Related Art

Generally, semiconductor chips are packaged to physically protect the semiconductor chips from external environments. The semiconductor package includes leads that carry electrical input and output signals to and from an external device. Since the operational goal of semiconductor memory chips is to reduce power and increase the speed, the semiconductor package is required to evolve beyond simply providing physical protection. To ensure the memory chip operation with higher performance and improved reliability, it is necessary to design package devices with optimal electrical characteristics. In conventional memory devices operating at low speed, deterioration of function or performance due to parasitic parameters of the package and an RLC circuit of the package substrate has not been considered as critical or significant.

However, certain memory devices capable of performing at very high speeds such as Rambus DRAMs operating at data rates up to 800 million transfers/second and DDR (Double Data Rate) RAMs exhibit all the properties of an RF signal. Phenomena like reflections and crosstalk take on unprecedented importance in the very high frequency memory devices. Further, at the speeds of Rambus, parasitic parameters due to the package may significantly degrade performance of the memory device, potentially causing failures. The three electrical parameters, i.e., capacitance, inductance, and resistance, are inherent in every packaging concept. Resistance may cause signal line DC drops while contributing to charging delays in RC networks. On the other hand, resistance may also reduce undesired noise at a system level. The capacitance of a channel is mainly responsible for signal loss and propagation velocity and can be reduced by reducing the physical dimensions of the RC networks. Inductance also contributes to switching noise and delays associated with packages. A low dielectric constant is favorable both for signal delay and crosstalk, which is the coupled noise from busy signal paths to idle paths caused by mutual capacitive and inductive coupling. If inductance is reduced, a stable power supply, improved crosstalk and decreased signal skew are observed. Capacitance and inductance may be expressed in static parasitic parameters including inductance of signal trace, mutual capacitance and mutual inductance and in dynamic parasitic parameters such as an SSO (Simultaneously Switching Output) noise and crosstalk.

In a substrate having multiple conductive and insulating layers, the capacitance and the inductance are opposing properties in the substrate or connection structure of a package. Therefore, modification of the connection structure to decrease inductance is inevitably accompanied by an increase of parasitic parameters and capacitance.

SUMMARY OF THE INVENTION

The present invention can simultaneously improve inductive and capacitive elements of a connection structure in a semiconductor chip package.

Also, the present invention provides a novel connection structure for ensuring stable electrical characteristics of a semiconductor chip operating at very high frequency.

According to one embodiment of the present invention, an electrical connection structure for electrically connecting a semiconductor chip to an external circuit device is provided. The connection structure comprises: a ground conductive plate connected to ground power of the semiconductor chip; an insulating layer formed on the ground conductive plate; and a signal pattern layer formed on the insulating layer and having signal patterns in electrical communication with the semiconductor chip. The ground conductive plate includes a projected blank pattern that corresponds to the signal pattern layer.

With the present invention, self inductance and mutual inductance of the connection structure is reduced. Further, because of the blank patterns formed in the proximal ground plate, the capacitance is also reduced. Therefore, both the switching output noise and cross talk is simultaneously prevented in very high frequency operation and hence electrical characteristics and performance are significantly improved in package devices such as wafer level packages and ball grid array packages operating at high data rates.

According to another embodiment of the present invention, an electrical connection structure for electrically connecting a semiconductor chip to an external circuit device comprises: a ground conductive plate connected to ground power of the semiconductor chip; an insulating layer formed on the ground conductive plate; a signal pattern layer formed on the insulating layer and having signal patterns communicating electrical signals with the semiconductor chip. The ground conductive plate, the insulating layer and the signal pattern are stacked sequentially. The signal pattern layer includes a chip connection portion electrically connected to the semiconductor chip, an external connection portion electrically connected to the external circuit device and a pattern line portion for electrically connecting the chip connection portion with the external connection portion. The ground conductive plate includes blank patterns having shapes corresponds to at least one of the chip connection portion, the external connection portion and the pattern line portion.

The connection structure of the present invention can be applied to a wafer level package that is assembled in a batch wafer process for fabricating on-chip circuits of semiconductor chips on a silicon wafer, or applied to a ball grid array package.

These and other features, and advantages, will be more clearly understood from the following detailed description taken in conjunction with the accompanying drawings. It is important to point out that the illustrations may not necessarily be drawn to scale, and that there may be other embodiments of this invention that are not specifically illustrated.

BRIEF DESCRIPTION OF THE INVENTION

DETAILED DESCRIPTION OF PREFERRED EMBODIMENTS

Figure 1:
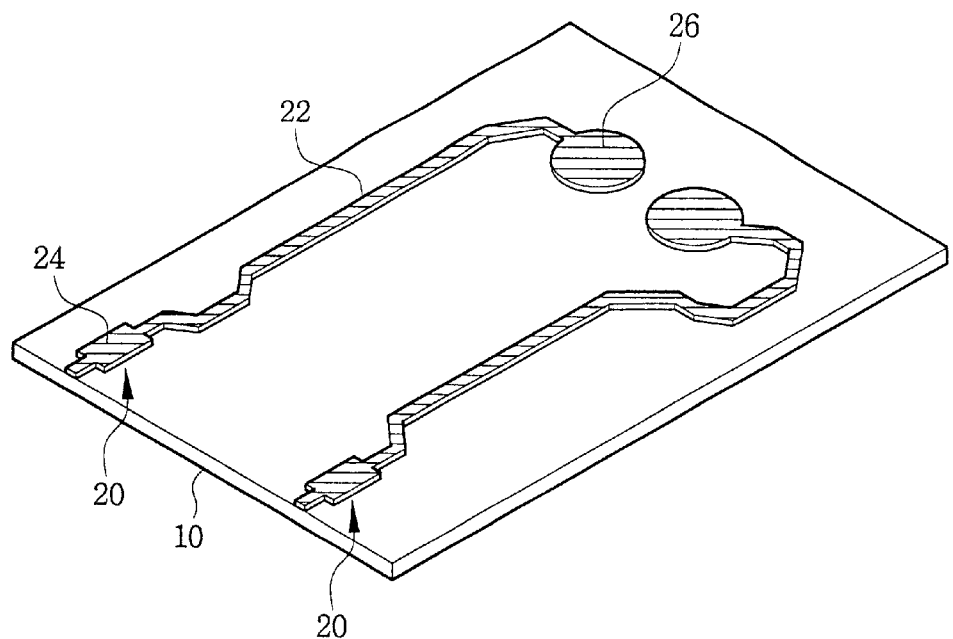
FIG. 1 shows an exemplary pattern layer suitable for use in a connection structure of the present invention.
Figure 2:
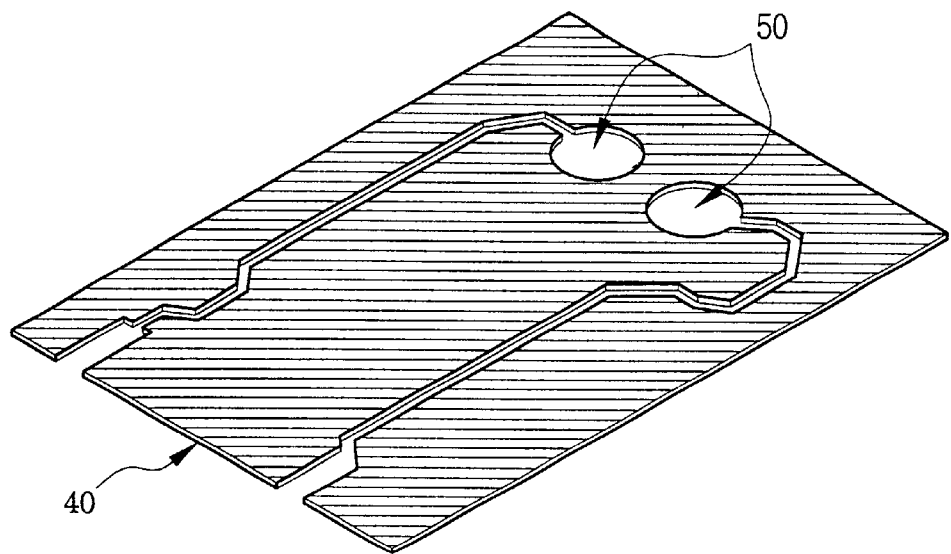
FIG. 2 is an exemplary ground metal plate as used in a connection structure of one embodiment of the present invention.

FIG. 1 shows a signal pattern layer suitable for use in a connection structure according to one embodiment of the present invention, and FIG. 2 shows a ground metal layer as used in this exemplary connection structure. This embodiment uses a connection structure in a plate shape.

An electrically conductive signal pattern layer 20 is formed on an electrically insulating layer 10. The insulating layer 10 can comprises a hard BT (Bismaleimide-Triazine) epoxy resin or a flexible polyimide film or polyimide tape. A person skilled in the art will appreciate that other suitable insulating materials can be used for the insulating layer 10. The conductive signal pattern layer 20 is made of a metal such as copper and formed or patterned by a conventional photolithography process.

The signal layer 20 comprises a chip connection portion 24, a pattern line 22 and an external connection portion 26. The chip connection portion 24 is electrically connected to a semiconductor chip mounted on a substrate. That is, the chip connection portion 24 is electrically connected to an electrode pad formed on an active surface of the chip. The external connection portion 26 electrically connects the semiconductor chip mounted on the substrate to an external circuit device such as a mother board of a computer system. If external connection terminals such as solder balls are attached to the external connection portion 26, the external connection portion 26 may be a solder ball land. The chip connection portion 24 and the solder ball land external connection portion 26 are interconnected by the pattern line 22. It should be noted that the shape and arrangement of the signal pattern layer 20 shown in FIG. 1 is a mere example for illustrating purpose. A person skilled in art will appreciate that the chip connection portion 24 and the external connection portion 26 can be adequately modified depending on how the semiconductor chip is mounted on a substrate and the connection scheme of the chip to an external circuit device.

Referring to FIG. 2, a ground plate 40 includes blank patterns 50 mirroring signal patterns projected onto the plate 40. The ground plate 40 is made of, for example, copper material. The ground plate 40 with the blank patterns 50 may be obtained by a photo-etching technology or through a mechanical punching process.

Figure 3:
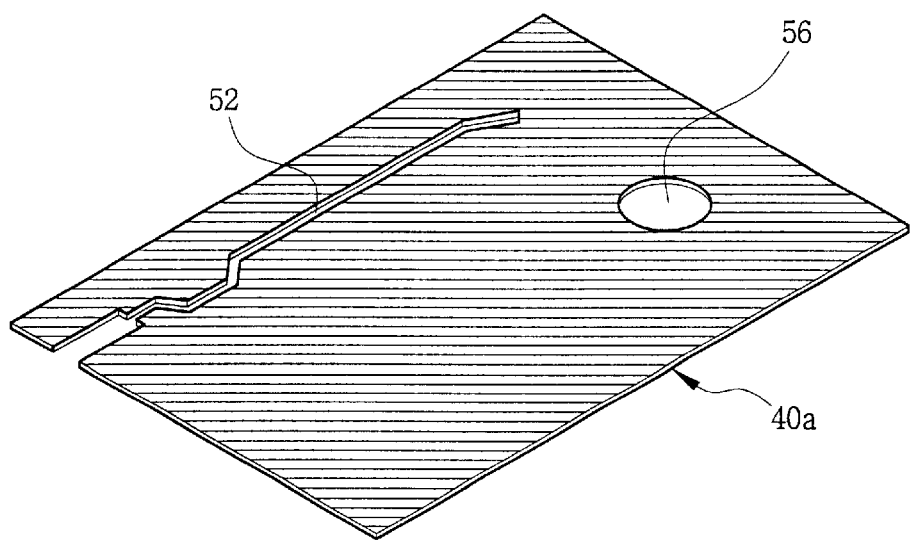
FIG. 3 is another exemplary ground metal plate as used in a connection structure of the present invention.

FIG. 3 shows another embodiment of a ground plate for use in a substrate.

In this embodiment, a ground plate 40a includes blank patterns 52 and 56 obtained by partially projecting signal patterns of the pattern layer 20 onto the plate 40. For example, the chip connection portion 24 and the pattern line 22 are projected to the ground plate 40a to form a partially projected blank pattern 52, or only the external connection portion 26 of the signal patterns is projected to the ground plate 40a to form a partially projected blank pattern 56.

Whether all or portion of the signal patterns are to be projected to the ground plane is determined by which of the reductions in capacitance and inductance is given priority.

Figure 4:
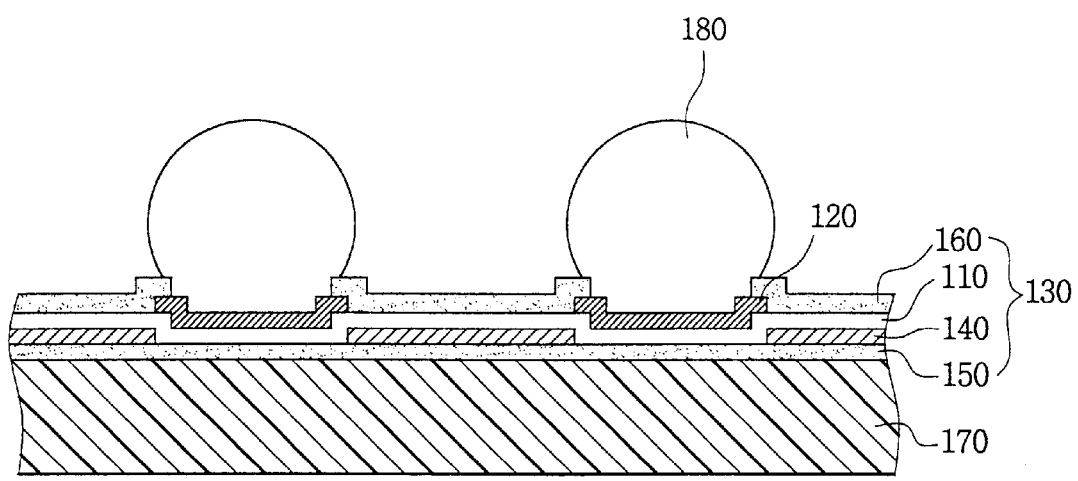
FIG. 4 is a partial cross-sectional view of a connection structure according to an embodiment of the present invention.

FIG. 4 is a partial cross-sectional view of a semiconductor chip package employing another connection structure of one embodiment of the present invention.

In this embodiment, the connection structure is applied to a wafer level package (WLP) device. Utilizing area array packaging concepts, the WLP can make the package outline the size of the chip itself. The WLP is defined as the complete packaging of a component at the wafer level. The WLP process can provide the complete packaging solution with no additional processing at the die level either during fabrication or assembly. The WLP utilizes equipment and processes that processes all die on the wafer simultaneously for each step.

A true WLP allows for the first time the ability to keep the cost of the IC package a relatively constant percentage of the total IC cost. Historically with standard IC packaging technology the cost of the package became a greater percentage of the total IC cost as the semiconductor die shrinks. In some applications the cost of individual IC packaging has exceeded the cost of the IC itself.

One significant advantage to wafer level packaging is the potential to integrate more fully the function of the package with the function of the chip. Thus, power and ground distribution and global wire route or critical clocks could be accommodated for using relatively thick, wide, and highly conductive copper. Such an approach could potentially reduce pin counts on the package while increasing performance, and/or reducing power requirements.

In FIG. 4, a plurality of semiconductor chips are formed in a semiconductor, e.g., silicon wafer 170. In each of the chips, on-chip circuits are formed in a batch wafer fabrication process. The on-chip circuit communicates with the external world via electrode pads exposed by a passivation layer covering the wafer surface. For simplicity, the electrode pads and the passivation layer are omitted in FIG. 4. The passivation layer can be formed by depositing a PSG (Phosphor-Silicate Glass) film or a film comprising $SiO_2$ and/or $Si_3N_4$. The films can be deposited by conventional techniques such as CVD (Chemical Vapor Deposition) process. The deposited films are then etched to expose the electrode pads.

In the wafer surface, there is formed a connection structure 130 according to the present invention. The connection structure connects the electrode pads of the semiconductor chip to an external world, and is formed by a batch wafer process for fabricating the on-chip circuit on the wafer. The connection structure 130 comprises a first insulating layer 150, a ground conductive plate such as a ground metal plate 140, a second insulating layer 110 and signal pattern layer 120.

The first insulating layer 150 is deposited on the passivation layer on the wafer surface, but not on the electrode pads. The first insulating layer 150 is, for example, made of polymer.

The ground metal layer 140 is formed by depositing and etching a metal layer on the first insulating layer 150. The ground metal layer 140 provides ground power to the chip and includes projected blank patterns that correspond to patterns of the signal layer 120 to be formed thereon. For instance, the blank patterns are formed by removing from the layer 140 a metal material at locations where signal patterns 120 exist as projected onto the ground metal layer 140. The ground metal layer 140 is, for example, made of copper.

The second insulating layer 110 is formed by depositing an insulating material on the ground metal layer 140 and etching the deposited insulating material. The second insulating layer 110 can be made of the same material as the first insulating layer 150.

By depositing and patterning a metal layer on the second insulating layer 110, a signal pattern layer 120 is formed. The signal pattern layer 120 can be made of the same material as the ground metal layer. To unsure sufficient thickness of the signal pattern layer, a sputtering copper layer can be used together with a plating copper layer.

The obtained connection structure 130 is electrically interconnected to an external device, e.g., a circuit mother board via external terminals 180 such as solder balls. The solder balls are attached to solder ball lands formed by depositing a third insulating layer 180 on the signal pattern layer 120 and etching a portion thereof. The solder balls may be attached by a method used in the conventional BGA packaging process.

Figure 5:
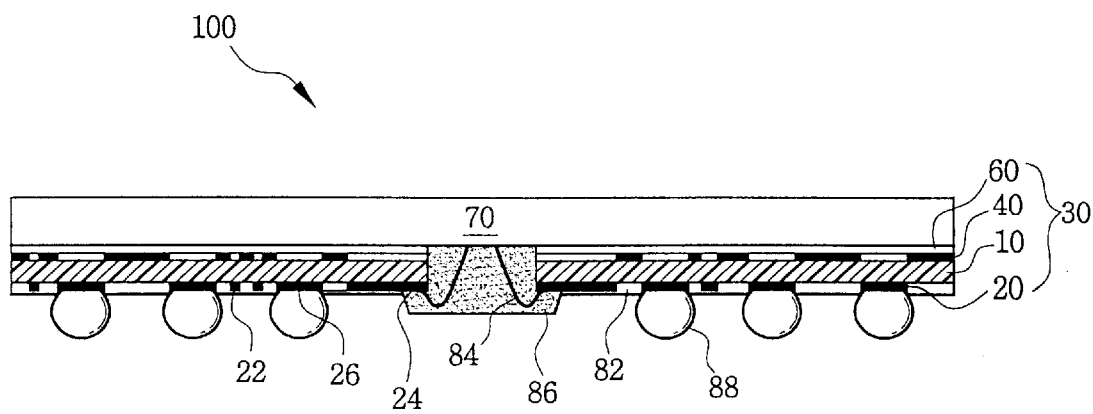
FIG. 5 is a cross sectional view of a ball grid array package having a connection structure according to one embodiment of the present invention.

FIG. 5 is a cross sectional view of another semiconductor chip package employing a connection structure of the present invention.

The package shown in FIG. 5 is WBGA (Wire bonding BGA) where a plurality of solder balls are included and the semiconductor chip and the substrate are electrically interconnected via conductive bonding wires. In this embodiment, the connection structure is in the form of a substrate 30.

The semiconductor chip 70 is face-down bonded (i.e., the active surface where electrode pads are formed faces downwardly) to the connection structure substrate 30. The substrate 30 is made of a polymeric material such as an elastomer 60, a ground plate 40, a polymeric tape such as a polyimide tape 10 and a signal pattern layer 20. The signal pattern layer 20 is, for instance, formed by photo-etching or electro-plating a copper metal, and provided with a barrier layer thereon made of nickel/gold alloy. The connection structure 30 is preferably formed by sequentially stacking the ground conductive plate 40, the insulating layer 10 and the pattern layer 20.

The signal pattern layer 20 is electrically interconnected to the electrode pads of semiconductor chip 70 via bonding wires 84. The exposed region in the active surface of the semiconductor chip 70 is covered with an encapsulant 86.

The signal pattern layer 20 is selectively deposited by a solder resistor 82 such as PSR (Photo-Sensitive Resistor) to expose solder ball lands 26 to which solder balls 88 are attached. The solder balls electrically interconnect the semiconductor chip 70 to an external device.

The improvements in capacitance and inductance of a substrate for a semiconductor chip package when using a ground plate will be explained.

(1) Self Inductance and Mutual Inductance

The substrate 20 of the present invention can be viewed as comprising two signal patterns 20 formed on a ground plane 40 with an interposing insulating layer 10. Therefore, self inductance Ls decreases as a distance 'h' between the ground plane 40 and the signal patterns 20 decreases. Further, self inductance Ls decreases as a width 'w' of the signal patterns 20 increases. This relationship is shown in Formula 1.

$$L_s \alpha h/w \quad \text{(Formula 1)}$$

Further, mutual inductance Lm has lower value as the distance 'd' between the signal patterns increases and a height 'h' to the ground plane 40 decreases as shown in Formula 2.

$$L_m \alpha h/d \quad \text{(Formula 2)}$$

Accordingly, both the self inductance and the mutual inductance can be reduced in accordance with the present invention, because the ground plane 40 is provided close to the signal patterns 20.

(2) Simultaneously Switching Output (SSO) Noise

In high frequency semiconductor IC devices, a voltage drop occurs when multiple signals simultaneously switch, causing a reduction in power level, a decline in driving capacity of the device and a signal delay. For preventing SSO noise, loop inductance should be kept at a minimum.

The loop inductance of a high frequency memory device is determined by an imaginary loop area formed by a current flowing in a signal trace and a return current flowing in an adjacent ground trace. Because the return current tends to flow along a path of minimum inductance, the ground trace closest to the signal trace provides the path of the return current. Therefore, if the ground plane is disposed just below the signal pattern layer, the loop area and hence the loop inductance can be reduced.

The loop inductance is expressed as:

$$L_I = (L_{SIG} + L_{GND} - 2L_{SIG\_GND}) \quad \text{(Formula 3)}$$

Where, $L_I$ is a loop inductance, $L_{SIG}$ is a self inductance of a signal trace, $L_{GND}$ represents a self inductance of a ground path, and $L_{SIG\_GND}$ is a mutual inductance of the signal trace and the ground path. As apparent from Formula 3, when a ground path is formed in a plate structure and located just below the signal line, the self inductances of the signal line $L_{SIG}$ and the ground path $L_{GND}$ are decreased while the mutual inductance of the signal line the ground path $L_{SIG\_GND}$ is increased, resulting in a decrease of the loop inductance $L_I$. Further, the plate structured ground path can provide stable feedback current path for all signal lines.

(3) Crosstalk

In order to understand the crosstalk from the mutual inductance and mutual capacitance between neighboring signal traces, we consider two cases: current flows in two signal lines having identical direction (referred to as 'an even mode'); and current flows with phase shift of 180 degrees to each other, i.e., current flows in opposite directions (referred to as 'an odd mode'). When currents start flowing to the neighboring signal traces, an electric field is generated differently depending on the even or odd mode. As a result, the propagation velocity of the signal traces differs according to the current mode. The discrepancy in the propagation velocity may cause a deformation in signal waveforms and increased coupling noise. Moreover, the difference in two modes reduces the timing margin of a system. To secure stable signal input and output and enough timing margin in a high-speed memory device, it is required to keep the difference between the propagation velocity in the even and odd modes as small as possible.

One method of reducing the difference in the propagation velocity is to decrease the mutual parameters. As shown in Formula 2, the mutual inductance decreases as the distance to the ground is smaller. On the other hand, the mutual capacitance has an equal or slightly smaller value when compared with a standard structure (where the signal trace and the ground trace exist in a single plane), as the distance to the ground decreases. Therefore, for the purpose of minimizing the difference in the propagation velocity of the even and odd modes, the inventive structure where the ground plane lies just below the signal pattern layer is superior to the standard structure.

When a multi-layered substrate is used to connect a high-speed semiconductor chip to the external world, since the electrical signals within the substrate switch at very high rates, both the inductance and capacitance of the substrate significantly affect the signal transfer characteristics. In particular, the noise generated from the simultaneous switching of signals is one of the most critical issues in the high-frequency IC devices. As shown in Formula 4, when the current 'i' varies over the time 't,' a voltage drop 'ΔV' proportional to the magnitude of the inductance occurs.

$$\Delta V = L_f (di/dt) \quad \text{(Formula 4)}$$

Figure 6:
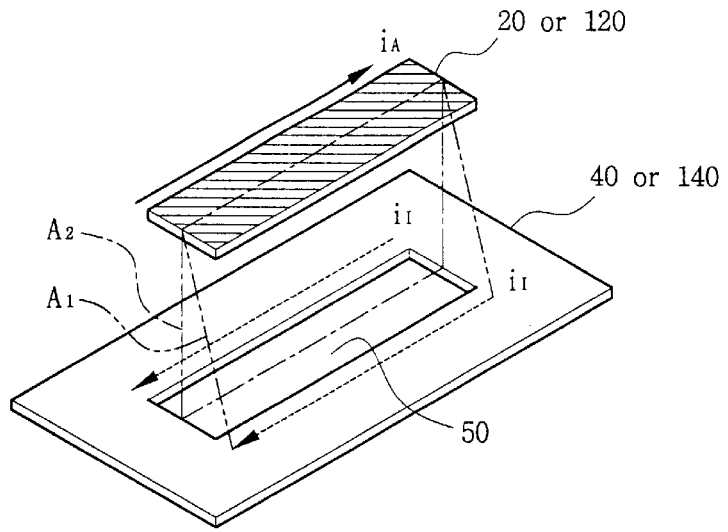
FIG. 6 is a schematic perspective view for illustrating inductance improvement by a connection structure of the present invention.

$L_f$ represents an effective loop inductance between the signal trace and the ground trace. The loop inductance is caused by an image current returning to form a loop when a current flows in a signal trace. The return image current flows in minimum resistance path when frequency is low, but flowing in a minimum inductance path when frequency is high. The magnitude of the loop inductance is the loop area formed by the applied current and the image return current. The loop inductance is a kind of noise, which produces an unwanted voltage drop. Accordingly, in order to secure enough timing margin and stable power and signal voltage, the voltage drop ΔV due to the loop inductance must be kept minimized. As shown in FIG. 6, because the ground plate 40 is in close proximity to the signal pattern layer 20, when a current iA is applied to the signal pattern layer 20, a return current iI flows along a path having a minimum impedance, i.e., along a path surrounding the projected blank pattern 50 of the ground plate 40. The magnitude of the loop inductance becomes a loop area A1 formed by the applied current iA and the return current iI. Even though loop inductance magnitude A1 is slightly larger than the area A2, which would be obtained by a ground plate without the blank pattern, the difference is minimal.

Figure 7:
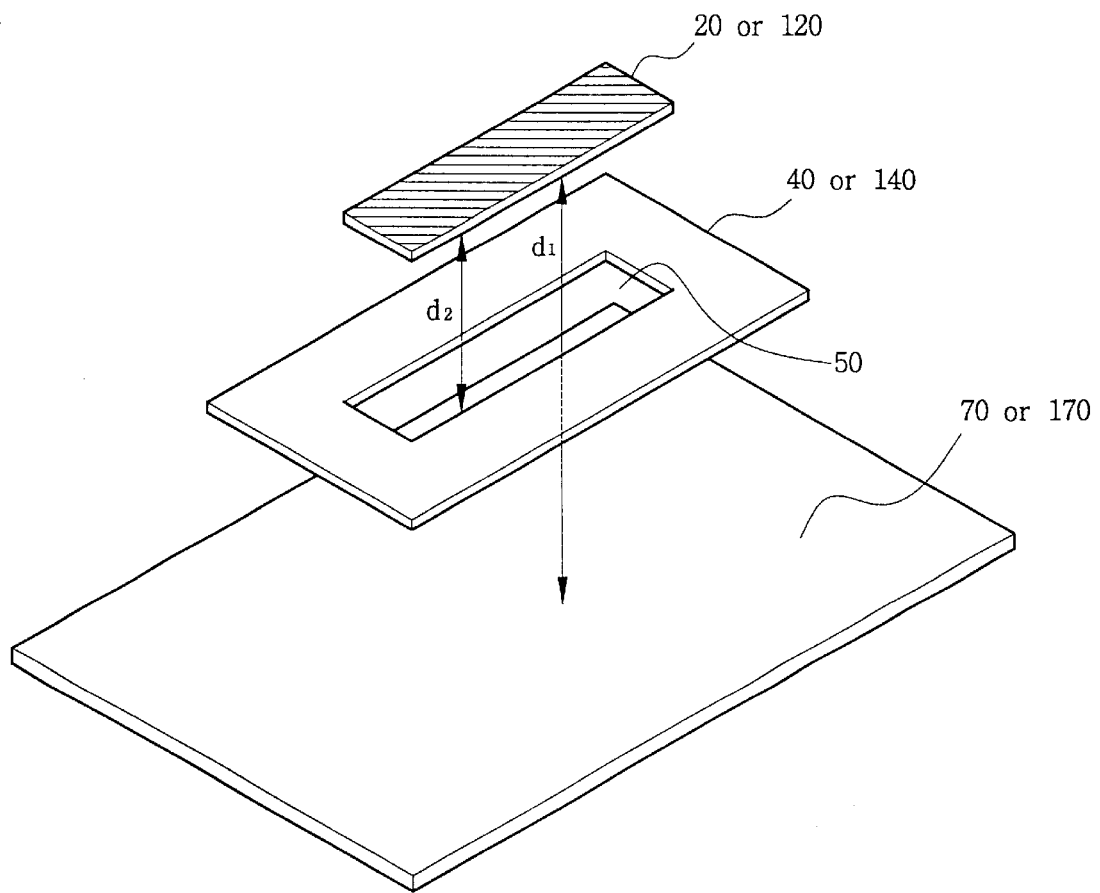
FIG. 7 is a schematic perspective view for illustrating capacitance improvement by a connection structure of the present invention.

The capacitance of the substrate is inversely proportional to the distance of the signal patterns 20 to another conductive trace. As shown in FIG. 7, with the ground plate 40 having the blank patterns 50, the capacitance of the substrate is affected by the distance 'd1' between the signal patterns 20 and the semiconductor chip 70. If the blank patterns are not formed in the ground plate, the capacitance depends on the distance 'd2' between the signal patterns 20 and the ground plane 40. As is apparent from this drawing, the capacitance of the substrate decreases when the projected blank patterns 50 are formed in the ground plate 40. In the structure of FIG. 7, dielectric layers exist between both the signal patterns 20 and the ground plate 40, and the ground plate 40 and the semiconductor chip 70 exist dielectric layers, but are omitted for simplicity.

As explained so far, with the connection structure of the present invention, it is possible to simultaneously reduce both the inductance and the capacitance of a substrate and guarantee desirable high frequency characteristics of a semiconductor IC device. In the drawings and specification, there have been disclosed typical preferred embodiments of this invention and, although specific terms are employed, they are used in a generic and descriptive sense only and not for purposes of limitation, the scope of this invention being set forth in the following claims.

What is claimed is:

1. An electrical connection structure for electrically connecting a semiconductor chip to an external circuit device, comprising:
    a ground conductive plate connected to ground power of the semiconductor chip;
    an insulating layer formed on the ground conductive plate; and
    a signal pattern layer formed on the insulating layer and having signal patterns in electrical communication with the semiconductor chip,
    wherein said ground conductive plate includes an opening that corresponds to the signal pattern layer.

2. The electrical connection structure of claim 1, wherein the signal pattern layer is electrically interconnected to the semiconductor chip by bonding wires.

3. An electrical connection structure for electrically connecting a semiconductor chip to an external circuit device, comprising:
    a ground conductive plate connected to ground power of the semiconductor chip;
    an insulating layer formed on the ground conductive plate; and
    a signal pattern layer formed on the insulating layer and having signal patterns communicating electrical signals with the semiconductor chip,
    wherein said signal pattern layer includes a chip connection portion electrically connected to the semiconductor chip, and a pattern line portion for electrically connecting the chip connection portion and external connection portion, and wherein said ground conductive plate includes an opening with a shape that corresponds to at least one of the chip connection portion, the external connection portion and the pattern line portion.

4. The electrical connection structure of claim 3, wherein the external connection portion is a solder ball land to be connected to a solder ball.

5. The electrical connection structure of claim 3, wherein the signal pattern layer is electrically interconnected to the semiconductor chip by bonding wires.

6. The electrical connection structure of claim 5, wherein said insulating layer comprises a polyimide tape and said signal patterns comprise copper.

7. The electrical connection structure of claim 5, wherein said insulating layer is BT (Bismaleimide-Triazine) epoxy resin and said signal patterns are copper patterns.

8. The electrical connection structure of claim 5, which is implemented in a plate format.

9. A wafer level package comprising:
    a semiconductor chip having an active surface with an on-chip circuit and electrode pads; and
    an electrical connection structure for electrically connecting the semiconductor chip to an external circuit device, comprising:
        a ground conductive plate connected to ground power of the semiconductor chip;
        an insulating layer formed on the ground conductive plate; and
        a signal pattern layer formed on the insulating layer and having signal patterns in electrical communication with the semiconductor chip,
        wherein said ground conductive plate includes an opening that corresponds to the signal pattern layer.

10. The wafer level package of claim 9, further comprising:
    external connection terminals electrically connected to the signal pattern layer of the connection structure.

11. A wafer level package comprising:
    a semiconductor chip having an active surface with an on-chip circuit and electrode pads; and
    an electrical connection structure for electrically connecting the semiconductor chip to an external circuit device, comprising:
        a ground conductive plate connected to ground power of the semiconductor chip;
        an insulating layer formed on the ground conductive plate; and
        a signal pattern layer formed on the insulating layer and having signal patterns communicating electrical signals with the semiconductor chip, wherein said signal pattern layer includes a chip connection portion electrically connected to the semiconductor chip, and a pattern line portion for electrically connecting the chip connection portion and the external connection portion, and wherein said ground conductive plate includes an opening with a shape corresponds to at least one of the chip connection portion, the external connection portion and the pattern line portion.

12. The wafer level package of claim 11, further comprising:

external connection terminals electrically connected to the signal pattern layer of the connection structure.

13. The wafer level package of claim 11, wherein said ground conductive plate includes the projected blank pattern with a shape complementary to at least one of the chip connection portion, the external connection portion and the pattern line portion.

14. The wafer level package of claim 1, wherein the opening mirrors the signal pattern layer.

* * * * *